United States Patent
Chen et al.

(10) Patent No.: US 6,767,274 B2
(45) Date of Patent: Jul. 27, 2004

(54) METHOD TO REDUCE DEFECT/SLURRY RESIDUE FOR COPPER CMP

(75) Inventors: Chi-Chun Chen, Kaohsiung (TW); Weng Chang, Taipei (TW); Shih-Chang Chen, Taoyuan (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/289,709

(22) Filed: Nov. 7, 2002

(65) Prior Publication Data

US 2004/0092210 A1 May 13, 2004

(51) Int. Cl.[7] .................................................. B24B 1/00
(52) U.S. Cl. ............................ 451/37; 451/41; 451/54
(58) Field of Search ................................ 451/7, 37, 41, 451/53, 54, 57, 60, 65

(56) References Cited

U.S. PATENT DOCUMENTS

| | | | |
|---|---|---|---|
| 5,855,792 A | * 1/1999 | Adams et al. | 210/696 |
| 6,099,662 A | * 8/2000 | Wang et al. | 134/26 |
| 6,234,870 B1 | 5/2001 | Uzoh et al. | 451/8 |
| 6,274,478 B1 | 8/2001 | Farkas et al. | 438/626 |
| 6,276,996 B1 | 8/2001 | Chopra | 451/41 |
| 6,325,698 B1 | * 12/2001 | Wada et al. | 451/8 |
| 6,328,042 B1 | 12/2001 | Gotkis | 134/1.3 |
| 6,361,407 B1 | * 3/2002 | Lu et al. | 451/41 |
| 6,409,582 B1 | * 6/2002 | Togawa et al. | 451/67 |
| 6,443,814 B1 | * 9/2002 | Miller et al. | 451/41 |
| 6,464,568 B2 | * 10/2002 | Miller et al. | 451/41 |
| 6,626,739 B1 | * 9/2003 | Wada et al. | 451/41 |
| 6,634,930 B1 | * 10/2003 | Chen et al. | 451/41 |
| 6,638,145 B2 | * 10/2003 | Hall et al. | 451/41 |
| 6,643,882 B1 | * 11/2003 | Sotozaki et al. | 15/77 |

\* cited by examiner

Primary Examiner—Joseph J. Hail, III
Assistant Examiner—David B. Thomas
(74) Attorney, Agent, or Firm—George O. Saile; Stephen B. Ackerman

(57) ABSTRACT

A new method and sequence is provided for the polishing of the surface of a layer of metal containing copper. The invention provides for an improved method of residue removal. The invention improves the removal of slurry as part of the step of applying DIW by, during the step of applying DIW, raising the wafer carrier, thus allowing uninhibited removal of the slurry from the surface that is being polished.

32 Claims, 1 Drawing Sheet

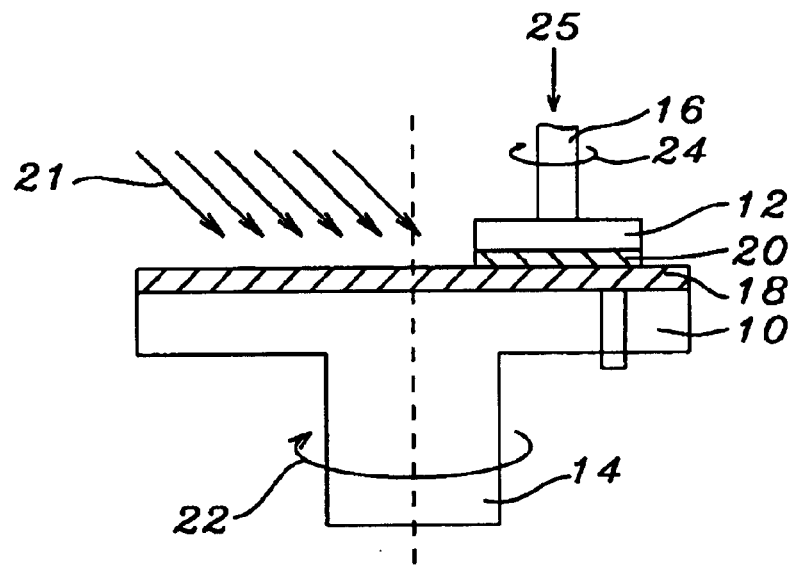
*FIG. 1 – Prior Art*
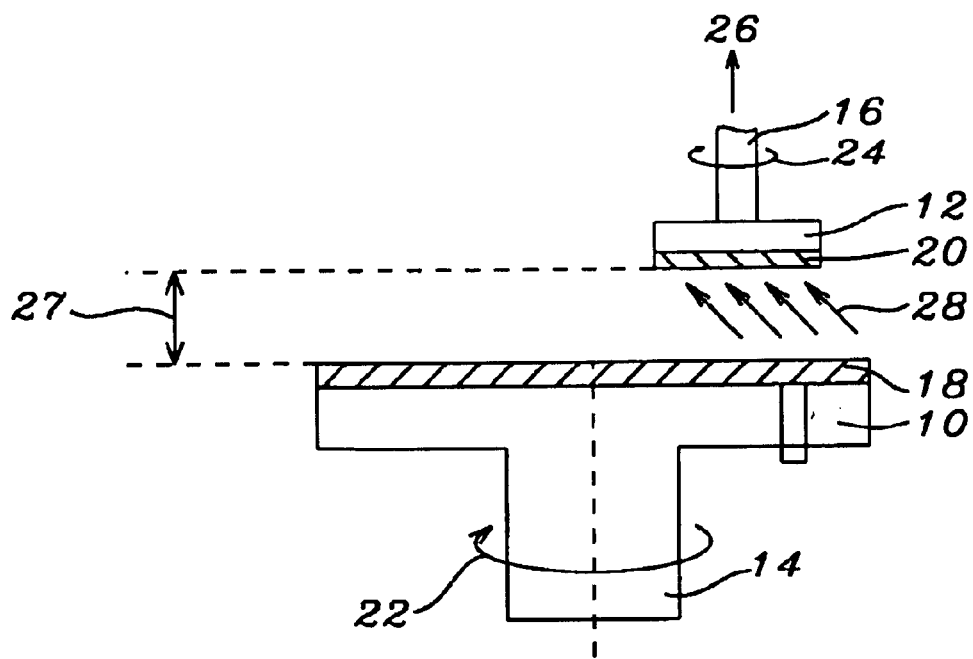
*FIG. 2*

METHOD TO REDUCE DEFECT/SLURRY RESIDUE FOR COPPER CMP

BACKGROUND OF THE INVENTION (1) Field of the Invention

The invention relates to the fabrication of integrated circuit devices, and more particularly, to a method for improved and increased removal of residue created during and as a result of the process of polishing a copper surface.

(2) Description of the Prior Art

One of the critical parameters that must be maintained during the creation of a semiconductor device is the planarity of surfaces that form part of the created semiconductor device. A number of different methods can be used to achieve and maintain surface planarity, of these methods the process of Chemical Mechanical Polishing (CMP) has become a leading method of planarization for advanced, high-performance Integrated Circuit (IC) devices.

One of the methods that have in addition been applied for the improvement of device performance is to use methods of interconnect that result in low resistive loss over lines of interconnect of the devices. This has led to the introduction of copper as an interconnect medium, whereby in addition and for reasons of production efficiencies, a damascene or dual damascene process is frequently applied for the creation of such interconnects. This leads to the situation whereby requirements of copper polishing, using methods of CMP, are one of the more critical processing steps, particularly applied during the backend creation of interconnect metal comprising copper. As a result, the process of planarizing copper surfaces has the potential of becoming a major yield detractor in creating semiconductor devices. This leads to the need for providing a method of polishing copper surfaces that is readily integratable into a manufacturing process and that has no or a minimum impact on production yield.

One of the sources that have been identified as being a cause of problems encountered during polishing of copper surfaces is the residue of semiconductor materials in the slurry that is used as part of the process of CMP. This residue can for instance be created by un-dissolved chemicals, metals and the like. A common practice to reduce the presence of polishing slurry and the therein contained and undesirably residue is the application of a step of thoroughly rinsing a polished surface with DI water (DIW). This step however adds relative complexity and therewith cost to the process of creating semiconductor devices. It is therefore desirable to provide a method of polishing metal surfaces, preferably comprising copper, such that the polishing process meets requirements of surface planarity, cost, yield and throughput. The invention addresses these concerns and provides such a method.

U.S. Pat. No. 6,328,042 B1 (Gotkis) shows a method to remove residue post copper chemical-mechanical polish.

U.S. Pat. No. 6,234,870 B1 (Uzoh et al.) shows an electro-chemical mechanical wafer processor including heads and rinses.

U.S. Pat. No. 6,2676,996 (Chopra) shows a copper CMP process.

U.S. Pat. No. 6,274,478 B1 (Farkas) reveals a copper CMP process.

SUMMARY OF THE INVENTION

A principle objective of the invention is to provide an improved method of polishing copper surfaces.

Another objective of the invention is to provide an improved method of slurry removal during the process of polishing a copper surface.

Yet another objective of the invention is to decrease a negative yield impact that is potentially introduced as a result of polishing a copper surface.

A still further objective of the invention is to provide a method of polishing the surface of a layer of copper that is cost-effective and that is readily integratable into a conventional processing stream of creating semiconductor devices.

In accordance with the objectives of the invention a new method and sequence is provided for the polishing of the surface of a layer of metal containing copper. One of the main problems that are conventionally encountered during the polishing of a copper surface is insufficient removal of the slurry and the therein contained residue of semiconductor materials. The invention therefore provides for an improved method of residue removal. Using the conventional step of applying DIW, the contact between the polishing pad and the surface that is being polished is constant and uninterrupted during the step of applying DIW. The invention improves the removal of slurry as part of the step of applying DIW by, during the step of applying DIW, raising the wafer carrier, thus allowing uninhibited removal of the slurry from the surface that is being polished. After the wafer carrier with the thereon contained wafer has been raised and thoroughly cleaned, the wafer carrier is again lowered, bringing the wafer in renewed contact with the polishing pad and allowing for the polishing of the copper comprising surface to proceed. The step of raising the wafer carrier may be repeated a number of times for further and additional removal of slurry from the interface between the wafer that is being polished and the polishing pad.

BRIEF DESCRIPTION OF THE DRAWINGS

FIG. 1 is a conventional method of polishing the surface of a substrate.

FIG. 2 is the method of the invention of polishing the surface of a substrate.

DESCRIPTION OF THE PREFERRED EMBODIMENTS

A number of considerations and aspects that have an influence on the polishing of semiconductor surface, specifically where these semiconductor surfaces contain copper, are first listed for reasons of providing a better understanding of the invention.

A frequently applied agent for the formation of a protective film over the surface of metals is benzotriazole (BTA) and BTA derivatives $BTA(C_6H_6N_3)$ is a widely used anti-corrosion agent applied as part of the slurry that is used during the process of copper CMP, this agent forms an organic copper/BTA layer Polymeric multi-layer copper/BTA created over the surface of a layer of copper is visually hydrophobic, resulting in the elimination of corrosion even in the presence of moisture in the interface that is in contact with the copper BTA is typically added to an oxide buffing slurry in order to remove the copper residue from the top surface of the layer of Inter Metal Dielectric (IMD) containing oxide The solubility of BTA in DIW is low, BTA more readily dissolves in an acidic solution Excessive BTA residue readily agglomerates, forming concentrations (or dots) of BTA over a copper surface after the copper surface has been polished using methods of CMP Conventionally, BTA/slurry is expected to be removed applying methods of post-CMP clean such as applying a scrubber, megasonic and wafer surface spin, with the further application of chemical agents, and It has been observed that, even with the application of steps of post-CMP clean, a post-CMP defect source remains the presence of BTA residue.

Conventional methods of polishing a semiconductor surface will next be briefly highlighted in order to provide a better understanding of the invention. Referring for this purpose specifically to the cross section that is shown in FIG. 1, there is shown a conventional or Prior Art CMP apparatus, wherein a polishing pad 18 is attached to a circular polishing table 10. The polishing table 10 rotates by means of axis 14 in a direction indicated by arrow 22, typically at a rate in the order of 1 to 100 RPM. A wafer carrier 12 holds wafer 20 face down against the polishing pad 18, the wafer 20 is typically held in place by applying a vacuum to the backside of the wafer (not shown). The wafer carrier 12 also rotates, as indicated by arrow 24, usually in the same direction as the polishing table 10, at a rate on the order of 1 to 100 RPM. Due to the rotation 22 of the polishing table 10, the wafer 20 traverses a circular polishing path over the polishing pad 18. A force 25 is also applied in the downward vertical direction against wafer 20 to press the wafer 20 against the polishing pad 18 as it is being polished. The force 25 is typically in the order of 0 to 15 pounds per square inch and is applied by means of a shaft 16 that is attached to the back of wafer carrier 12. Slurry (not shown) is provided to the top of the polishing pad 18 to further enhance the polishing action of polishing pad 18.

During the step of applying DIW, the DIW 21 is applied to the surface of the polishing pad 18. The step 21 of DIW polish is typically the last step of the polishing process, this step has the express purpose of removing the slurry residue from the surface of the polishing pad 18 and there-with from the interface between the polishing pad 18 and the wafer 20, hence from the surface of the wafer 20 that has been polished. However, experience has shown that slurry residue as yet accumulates and remains in place in the interface between the polishing pad 18 and the surface of wafer 20 being in contact with the polishing pad 18.

The invention therefore, and in order to remove the cause for the accumulation of residue at the interface between the polishing pad 18 and the surface of the wafer 20 that is being polished, provides for separating these two interfacing surfaces and specifically making the polished surface of the wafer 20 accessible for additional removal of residue that has accumulated over the surface thereof.

The invention provides for the step of creating an Interrupted DI Rinse (IDIR), which divides the conventional DIW polishing step into several increments and by applying a Rise-Head Rinse (RHR) step by interrupting the conventional DIW polishing step. This is further highlighted in the cross section that is shown in FIG. 2, wherein specifically are highlighted:

26, the motion that separates the wafer 20 that is being polished from the surface of the polishing pad 18, separating the two interfacing surfaces of respectively the wafer 20 and the polishing pad 18, thereby exposing the surface that is being polished of wafer 20

27, the distance created between the interfacing surfaces of respectively the wafer 20 and the polishing pad 18 as a result of motion 26, and 28, a new and additional DIW rinse that can now, due to the created separation 27 between interfacing surfaces of respectively the wafer 20 and the polishing pad 18, be applied to the exposed surface of the wafer 20 that is being polished.

It must be emphasized that, relating to and in addition to the cross section that is shown in FIG. 2, the invention allows for:

Repeating the motion 26 that is highlighted in the cross section of FIG. 2 a number of times Controlling parameters of application of the additional DIW rinse 28, specifically controlling parameters of the metric volume of DIW applied and the temperature of the applied DIW, the temperature of the DI water can be elevated between about 15 and 80 degrees C.

Experimental results have confirmed that the additional DIW rinse that is provided by the invention is instrumental in reducing the defect count over the surface of the wafer that is being polished.

For instance:

1. Not applying the RHR of the invention but varying the length of the conventional DIW polish:

A conventional sequence of applying a DIW polish after completion of polishing the surface of the wafer, as shown in the cross section of FIG. 1, resulted in a measured defect count over the polished surface of about 983, most defects were identified as BTA remaining in place over the polished surface, the DIW rinse having been applied for the duration of 1 minute; since the effect of the remaining BTA is relatively large, the review of other types of defects is limited thereby A conventional sequence of applying a DIW polish after completion of polishing the surface of the wafer, as shown in the cross section of FIG. 1, resulted in a measured defect count over the polished surface of about 262, 40% defect was identified as BTA remaining in place over the polished surface, the DIW rinse having been applied for the duration of 2 minutes, and 2. Applying the RHR of the invention for a constant duration and varying the length of the conventional DIW polish:

A sequence of applying a DIW polish followed by a RHR rinse after completion of polishing the surface of wafer, as shown in the cross section of FIG. 2, resulted in a measured defect count over the polished surface of about 694, 70% of the defects was identified as BTA remaining in place over the polished surface, the DIW rinse having been applied for the duration of 1 minute, the RHR rinse having been applied for a duration of 15 seconds; because the BTA remaining is sharply reduced, this approach allows for reviewing other types of defects A sequence of applying a first DIW polish (of approximately 1 minute duration) followed by a RHR rinse (of approximately 15 seconds duration) and a second DIW polish (of approximately 1 minute duration) after completion of polishing the surface of the wafer, as shown in the cross section of FIG. 2, resulted in a measured defect count over the polished surface of about 125; only 10% of the reviewed defects are BTA remaining in place over the polished surface; the first and second DIW polish having been applied for the duration of about 1 minute; the RHR rinse between the two steps of DIW rinse having been applied for a duration of about 15 seconds. Since the BTA remaining is sharply reduced, the BTA remaining no longer is the number one defect type, about 90% of the observed defects belong to other than BTA remaining types of defects.

From the above highlighted experimental results, it can be concluded that optimum results are obtained under conditions of first applying a conventional DIW polish after the surface of the wafer has been polished, for a duration of 2 minutes and then applying a RHR for the duration of 15 seconds. A defect count of 125 has been measured under these conditions while only 10% of the total defects are BTA related.

The above highlighted concepts can be extended as follows:

The RHR may be applied not only after metal surfaces, preferably comprising copper, have been polished but in addition may be applied after surfaces comprising for instance oxide or layers of IMD have been polished; slurry residue over the (for instance oxide) surface can by application of the RHR additionally be reduced A typical sequence of polishing, comprising:
1. copper polish with DIW polish, followed by
2. barrier layer polish with DIW polish, followed by
3. oxide buffing with DIW polish,
can be changed in accordance with the invention to a sequence of steps comprising:
  1. copper polish with DIW polish followed by RHR, then followed by
  2. barrier layer polish with DIW polish followed by RHR, and then followed by
  3. oxide buffing with DIW followed by RHR.

In other words, the conventional step of applying a DIW polish can be replaced by the step of DIW polish followed by HRH, independent of the nature of the polish that preceded the DIW polish such as oxide or barrier layer polish.

To review the invention it can be stated that conventional methods of polishing a semiconductor surface can be separated in steps of polishing the surface, aimed at providing required planarity, and steps of applying DIW, aimed at removing slurry residue from the surface after the polishing of the surface has been completed or partially completed. The second step of applying DIW polish has a negative impact on device throughput but is required for reasons of post-CMP defect performance. During the process of polishing a semiconductor surface, water is typically forced in a downward direction over the surface of the polishing pad.

It has been observed that, as a consequence of conventional methods of polishing a semiconductor surface, slurry residue and undesirable particles may adhere to the polished surface and may further be difficult to remove at a later stage of the semiconductor device fabrication process. The invention intentionally interrupts the step of DIW polish by creating a space between the surface of the polishing pad and the surface of the wafer that is being polished, thereby exposing the surface that is being polished, and by then performing a DIW rinse of the exposed surface of the wafer. The process of DIW polish can then be resumed and completed, the number of times that the polished surface is exposed in the manner indicated above is not limited to a one time exposure. Using the indicated method of polishing a semiconductor surface, preferably the surface of a semiconductor wafer, negative impact of post-CMP defects can be significantly reduced, thereby specifically affecting a reduction in the slurry residue over the polished surface.

The invention, which provides for polishing a semiconductor surface, can be extended and summarized as follows:

placing the surface face down against a first polishing pad performing Chemical Mechanical Polishing with a slurry performing a first DIW polish creating a space between the surface that is being polished and the first polishing pad, exposing the surface that is being polished applying a RHR rinse to the exposed surface that is being polished placing the surface that is being polished face down against a second polishing pad, and performing a second DIW polish of the surface that is being polished the first polishing pad and the second polishing pad being a same polishing pad the first polishing pad and the second polishing pad being different polishing pads the surface being polished comprising copper the surface being polished comprising a dielectric the surface being polished comprising oxide the slurry comprising benzotriazole (BTA)

the applying a first and second DIW polish comprising a DIW polish whereby an elevated temperature is applied to the DI water the elevated temperature being in a range between about 15 and 80 degrees C.

the first DIW polish being applied for a time of about 1 minute the RHR rinse being applied for a time of about 15 seconds the second DIW polish being applied for a time of about 1 minute Alternately, the invention, which provides for polishing a semiconductor surface, can be summarized as follows:

providing a semiconductor substrate, a layer of semiconductor material having been provided over the surface of the substrate;

providing a semiconductor polishing apparatus having a polishing medium;

inserting the semiconductor substrate into the semiconductor polishing apparatus, contacting the polishing medium, and performing at least one cycle of:
(i) performing Chemical Mechanical Polishing of the layer of semiconductor material using a slurry
(ii) applying a first DIW polish to the exposed surface of the semiconductor material;
(ii) separating the surface of the semiconductor material from the surface of the polishing medium, creating a distance between the surface of the semiconductor material and the surface of the polishing medium, exposing the surface of the semiconductor material;
(iii) applying a RHR rinse to the exposed surface of the semiconductor material;
(iv) bringing the surface of the semiconductor material in contact with the surface of the polishing medium; and
(v) performing a second DIW polish.

the layer of semiconductor material comprising copper the layer of semiconductor material comprising a dielectric the layer of semiconductor material comprising oxide the applying a first and second DIW polish comprising a DIW rinse whereby an elevated temperature is applied to the DI water the elevated temperature being in a range between about 15 and 80 degrees C.

the slurry comprising benzotriazole (BTA)

the polishing medium comprising one polishing pad the polishing medium comprising multiple polishing pads, a polishing pad being applied during the at least one cycle the first DIW polish being applied for a time of about 1 minute the RHR rinse being applied for a time of about 15 seconds the second DIW polish being applied for a time of about 1 minute.

Alternately yet, the invention can be summarized as follows:

a method to reduce slurry residue and therewith defects during and after the process of polishing a semiconductor surface using methods of Chemical mechanical Polishing (CMP) using a slurry by replacing a step of DI water rinse with at least one step of:
separating a surface being polished from a surface of a polishing medium, thereby exposing the surface that is being polished; and
applying a DI water rinse to the exposed surface of the semiconductor substrate.

the surface being polished comprising copper the surface being polished comprising a dielectric the surface being polished comprising oxide the slurry comprising benzotriazole (BTA)

the applying a DI water rinse comprising a DI water rinse under elevated temperature the elevated temperature being between about 15 and 80 degrees C.

the polishing medium comprising one polishing pad the polishing medium comprising multiple polishing pads, a polishing pad being applied during the at least one step.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of polishing a semiconductor surface, comprising:
    placing said surface face down against a first polishing pad;
    performing Chemical Mechanical Polishing with a slurry;
    performing a first DIW polish;
    creating a space between the surface that is being polished and the first polishing pad, exposing the surface that is being polished;
    applying a RHR rinse to the exposed surface that is being polished;
    placing the surface that is being polished face down against a second polishing pad; and
    performing a second DIW polish of the surface that is being polished.

2. The method of claim 1, the first polishing pad and the second polishing pad being a same polishing pad.

3. The method of claim 1, the first polishing pad and the second polishing pad being different polishing pads.

4. The method of claim 1, the surface being polished comprising copper.

5. The method of claim 1, the surface being polished comprising a dielectric.

6. The method of claim 1, the surface being polished comprising oxide.

7. The method of claim 1, the slurry comprising benzotriazole (BTA).

8. The method of claim 1, the applying a first and second DIW polish comprising a DIW polish whereby an elevated temperature is applied to said DI water.

9. The method of claim 8, said elevated temperature being in a range between about 15 and 80 degrees C.

10. The method of claim 1, the first DIW polish being applied for a time of about 1 minute.

11. The method of claim 1, the RHR rinse being applied for a time of about 15 seconds.

12. The method of claim 1, the second DIW polish being applied for a time of about 1 minute.

13. A method of polishing a semiconductor surface, comprising:
    providing a semiconductor substrate, a layer of semiconductor material having been provided over the surface of the substrate;
    providing a semiconductor polishing apparatus having a polishing medium;
    inserting said semiconductor substrate into said semiconductor polishing apparatus, contacting the polishing medium; and
    performing at least one cycle of:
        (i) performing Chemical Mechanical Polishing of the layer of semiconductor material using a slurry
        (ii) applying a first DIW polish to the exposed surface of the semiconductor material;

(ii) separating the surface of the semiconductor material from the surface of the polishing medium, creating a distance between the surface of the semiconductor material and the surface of the polishing medium, exposing the surface of the semiconductor material;

(iii) applying a RHR rinse to the exposed surface of the semiconductor material;

(iv) bringing the surface of the semiconductor material in contact with the surface of the polishing medium; and (v) performing a second DIW polish.

14. The method of claim 13, the layer of semiconductor material comprising copper.

15. The method of claim 13, the layer of semiconductor material comprising a dielectric.

16. The method of claim 13, the layer of semiconductor material comprising oxide.

17. The method of claim 13, the applying a first and second DIW polish comprising a DIW rinse whereby an elevated temperature is applied to said DI water.

18. The method of claim 17, the elevated temperature being in a range between about 15 and 80 degrees C.

19. The method of claim 13, the slurry comprising benzotriazole (BTA).

20. The method of claim 13, the polishing medium comprising one polishing pad.

21. The method of claim 13, the polishing medium comprising multiple polishing pads, a polishing pad being applied during the at least one cycle.

22. The method of claim 13, the first DIW polish being applied for a time of about 1 minute.

23. The method of claim 13, the RHR rinse being applied for a time of about 15 seconds.

24. The method of claim 13, the second DIW polish being applied for a time of about 1 minute.

25. A method to reduce slurry residue and therewith defects during and after the process of polishing a semiconductor surface using methods of Chemical mechanical Polishing (CMP) using a slurry by replacing a step of DI water rinse with at least one step of:

separating a surface being polished from a surface of a polishing medium, thereby exposing the surface that is being polished; and applying a DI water rinse to the exposed surface of said semiconductor substrate, said applying a DI water rinse comprising a DI water rinse under elevated temperature.

26. The method of claim 25, said surface being polished comprising copper.

27. The method of claim 25, said surface being polished comprising a dielectric.

28. The method of claim 25, said surface being polished comprising oxide.

29. The method of claim 25, said slurry comprising benzotriazole (BTA).

30. The method of claim 25, said elevated temperature being between about 15 and 80 degrees C.

31. The method of claim 25, said polishing medium comprising one polishing pad.

32. The method of claim 25, said polishing medium comprising multiple polishing pads, a polishing pad being applied during the at least one step.

* * * * *